US010425079B1

(12) United States Patent
Bytheway

(10) Patent No.: US 10,425,079 B1
(45) Date of Patent: Sep. 24, 2019

(54) DRIVEN SHIELD FOR A CAPACITANCE SENSOR

(71) Applicant: Cirque Corporation, Salt Lake City, UT (US)

(72) Inventor: Jared Bytheway, Sandy, UT (US)

(73) Assignee: Cirque Corporation, West Valley, UT (US)

( * ) Notice: Subject to any disclaimer, the term of this patent is extended or adjusted under 35 U.S.C. 154(b) by 0 days.

(21) Appl. No.: 15/977,604

(22) Filed: May 11, 2018

(51) Int. Cl.
*H03K 17/96* (2006.01)
*G06F 3/044* (2006.01)
*G01R 27/26* (2006.01)

(52) U.S. Cl.
CPC ....... *H03K 17/962* (2013.01); *G01R 27/2605* (2013.01); *G06F 3/044* (2013.01); *G06F 2203/04107* (2013.01); *H03K 2217/960765* (2013.01)

(58) Field of Classification Search
CPC .. H03K 17/955; H03K 17/962; H03K 17/975; H03K 2217/960765; G06F 2203/04107; G06F 3/044
See application file for complete search history.

(56) References Cited

U.S. PATENT DOCUMENTS

| 5,363,051 | A | * | 11/1994 | Jenstrom | G01B 7/023 324/661 |
| 5,963,679 | A | | 10/1999 | Setlak | |
| 6,842,018 | B2 | | 1/2005 | McIntosh | |
| 6,937,951 | B2 | * | 8/2005 | Gibb | H03K 17/955 324/674 |

* cited by examiner

*Primary Examiner* — Vanessa Girardi

(57) ABSTRACT

Improved driven shield electrodes used with capacitance sensors are described in this application. Typical capacitance sensors suffer from parasitic capacitance that can make proximity sensing difficult. The driven shield described herein is divided into multiple portions and an increased drive voltage is applied to at least one of these portions. This increase voltage enhances the electric field of the capacitance sensor and increases the proximity sensitivity. Other embodiments are described.

23 Claims, 3 Drawing Sheets

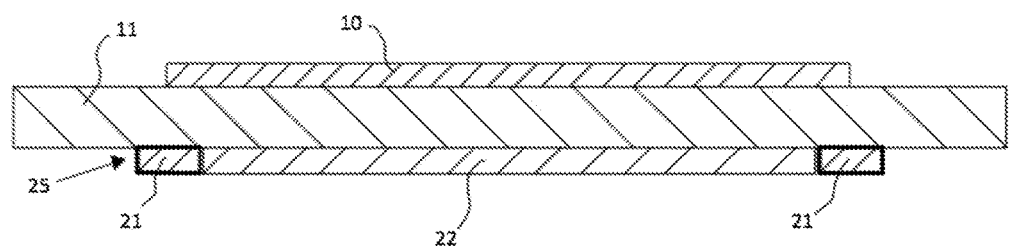
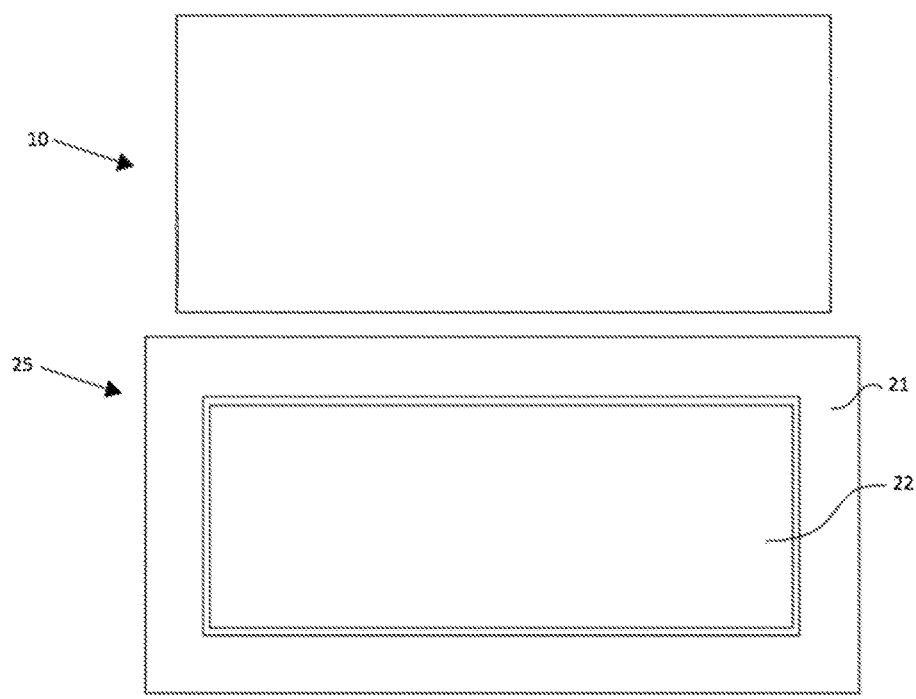

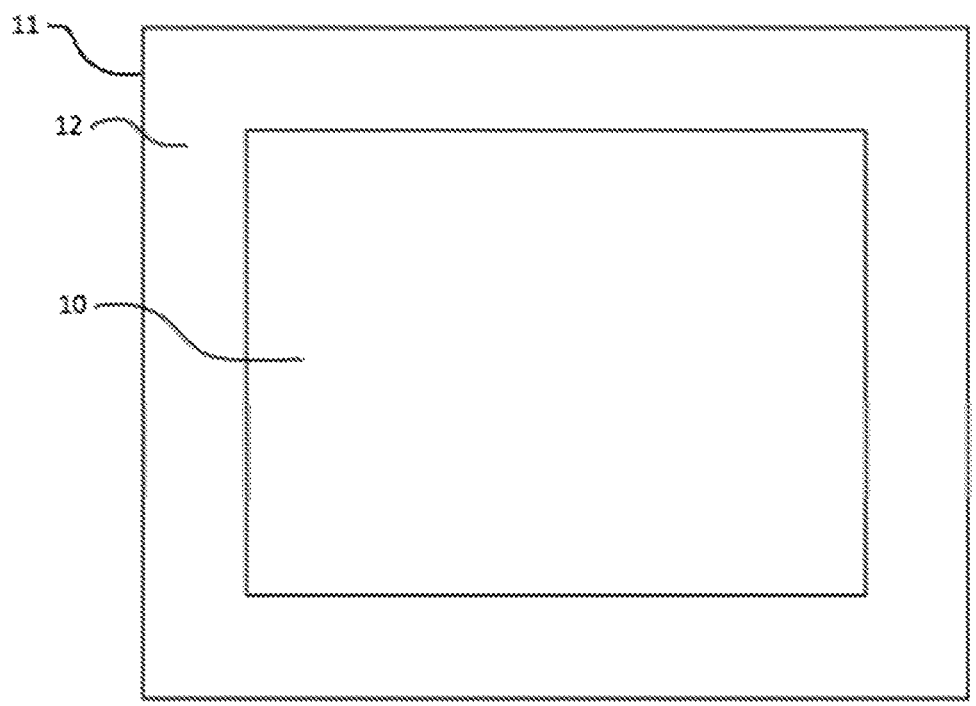
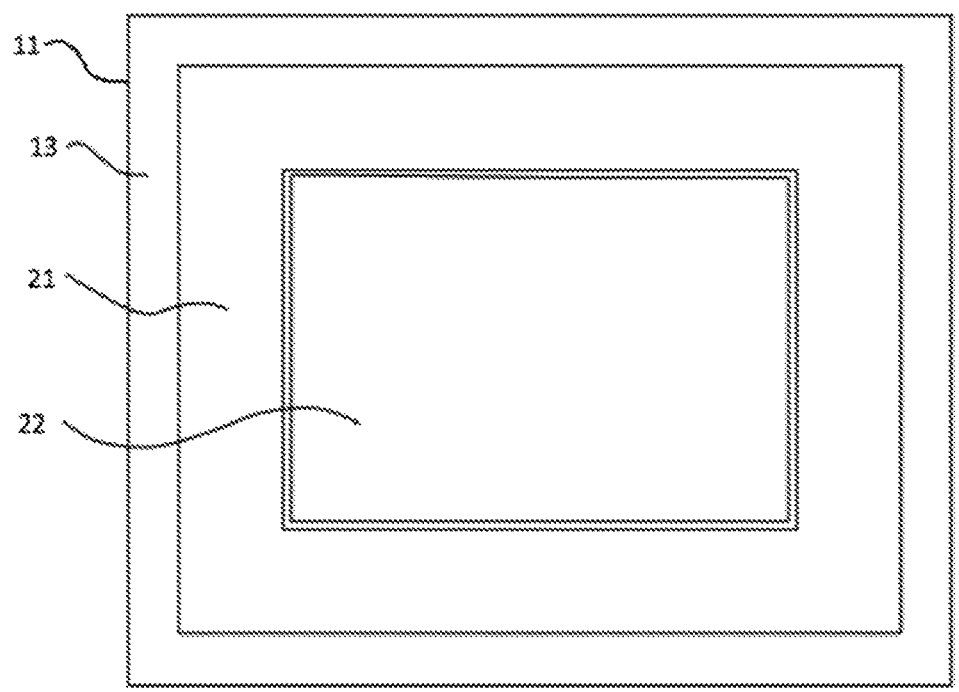

DRIVEN SHIELD FOR A CAPACITANCE SENSOR

FIELD

This application relates generally to self-capacitance sensors. Specifically, this application relates to an improvement to the shielding that can be placed near the conductive electrodes of the sensors to protect them from parasitic capacitances while increasing their projected electric fields, thereby improving their proximity sensitivity and performance.

BACKGROUND

Capacitors are electrical components that store electric energy. They function by having two conductive plates near each other but separated by an insulator known as a dielectric. To store a charge on a capacitor, one of the conductive plates is subjected to a voltage, forming an electrostatic field between the two conductive plates. As one plate collects a negative charge the other develops a positive charge. The ratio of the electric charge and the potential difference in voltage is called capacitance.

A typical self-capacitance sensor functions by measuring the change in capacitance of a system or capacitive loading when an external object comes near the driven conductive electrode in the system. If the external object is also a conductor, meaning it can conduct electricity, the capacitance of the system is changed and can be measured. The capacitance of the traces to the electrode sensor and the unwanted capacitance to ground cannot be distinguished from the wanted capacitance by the sensing circuit. When increasing the gain or electrode size, the effect of the parasitic capacitance is increased at the same rate as the desired capacitance. For self-capacitance electrodes the goal is to keep parasitic capacitance to a minimum and to maximize the size of the driven conducting plate. But as the size of the sensor is increased, the conductor is subject to increased electrical noise. Electrical noise can distort the sensing signal, making precise measurement or change in capacitance more difficult.

SUMMARY

This application relates generally to self-capacitance sensors. In particular, this application describes an improved driven shield that will increase the proximity sensitivity while maintaining the reduction in parasitic capacitance and shielding from electrical noise. An increase in gain and drive voltage on the electrode can increase the projected electric field of the sensor. An increase in electric field would increase the proximity sensitivity but increasing the drive voltage on the shield without any other changes also increases the parasitic capacitance. This application remedies this problem by dividing up the shield electrode into multiple portions. These multiple portions can be driven with similar voltages or varying voltages in order to shape the electric field. Some embodiments describe the shield electrode being divided into a driven portion and a grounded portion. The voltage applied to the driven portion can be increased without increasing the parasitic capacitance. In relation to the voltage applied to sense electrode, the voltage applied to the driven portion is increased by a multiplier that is equal to the ratio of the area of the grounded portion to the area of the driven portion so that the average of all the portions is the same as the voltage on the electrode.

This application describes methods for shielding a capacitance sensor. Some embodiments include providing a dielectric base layer with first and second surface, providing a capacitance sense electrode adjacent to the first surface of the dielectric base layer and driving the capacitance sense electrode using a toggling or changing voltage configured to detect a change in capacitance, and providing a shield electrode adjacent to the second surface of the dielectric base layer, with the shield electrode being divided into multiple portions.

Some embodiments further include the shield electrode's multiple portions comprising a combination of one or more driven portions and grounded portions. These combinations include but are not limited to: a driven portion with a grounded portion, multiple driven portions with a grounded portion, or multiple driven portions with no grounded portion.

BRIEF DESCRIPTION OF THE DRAWINGS

The following description can be better understood in light of Figures herein which show various embodiments and configurations of the self-capacitance sensors. Together with the following description, the Figures demonstrate and explain the principles of the structures, methods, and principles described herein. In the drawings, the thickness and size of components may be exaggerated or otherwise modified for clarity. The same reference numerals in different drawings represent the same element, and thus their descriptions will not be repeated.

FIG. 1 is a sectional view of some embodiments of a self-capacitance electrode with a driven shield.

FIG. 2 is a top view of some embodiments of a self-capacitance electrode with a substantially rectangular self-capacitance conductor and a driven shield divided into a driven portion and a grounded portion.

FIG. 3 is a top view of some embodiments of a self-capacitance electrode with a substantially rectangular shape attached to the top surface of a dielectric layer.

FIG. 4 is a bottom view of some embodiments of a driven shield divided into multiple portions with a substantially rectangular shape and attached to the bottom surface of a dielectric layer.

Figure 5:
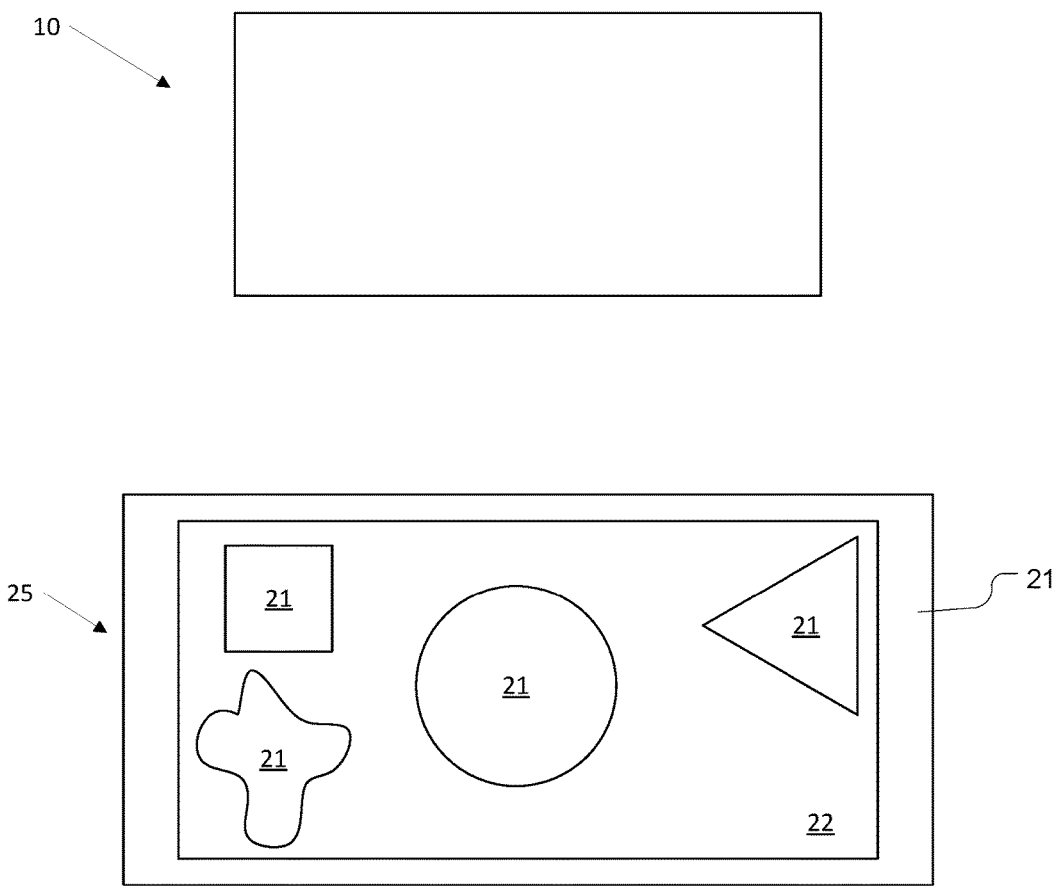
FIG. 5 is an exploded top view of some embodiments of a self-capacitance electrode with multiple drive shield portions.

In addition, as the terms on, disposed on, attached to, connected to, or coupled to, etc. are used herein, one object (e.g., a material, element, structure, member, etc.) can be on, disposed on, attached to, connected to, or coupled to another object—regardless of whether the one object is directly on, attached, connected, or coupled to the other object or whether there are one or more intervening objects between the one object and the other object. Also, directions (e.g., on top of, below, above, top, bottom, side, up, down, under, over, upper, lower, lateral, orbital, horizontal, etc.), if provided, are relative and provided solely by way of example and for ease of illustration and discussion and not by way of limitation. Where reference is made to a list of elements (e.g., elements a, b, c), such reference is intended to include any one of the listed elements by itself, any combination of less than all of the listed elements, and/or a combination of all of the listed elements. Furthermore, as used herein, the terms a, an, and one may each be interchangeable with the terms at least one and one or more.

DETAILED DESCRIPTION

The following description supplies specific details in order to provide a thorough understanding. Nevertheless, the skilled artisan will understand that the described devices can be implemented and used without employing these specific details. Indeed, the described devices and methods can be placed into practice by modifying the described systems and methods and can be used in conjunction with any other apparatus and techniques conventionally used in the industry, such as proximity touch sensor in gaming, automotive, home automation etc. While these devices and methods are described as being used for self-cap sensors, they can also be used in mutual cap sensors where parasitic capacitance needs to be reduced.

Some embodiments of the self-capacitance sensors (or self-cap sensors) are illustrated in FIGS. 1-2. The self-cap sensors comprise self-capacitance electrode with a driven shield. As shown in FIG. 1, the self-cap sensors comprise sense electrode layer 10 formed on the top surface of dielectric base layer 11. A shield layer 25 is formed on the bottom surface of dielectric base layer 11.

The sense electrode layer 10 can formed of any conductive material used in the art. In some embodiments, the sense electrode layer 10 can be formed of metals or metallic alloys including copper, aluminum, silver, gold, indium tin oxide, steel or any other conductor.

The sense electrode layer 10 can comprise any thickness that provides the desired conductivity of the layer. In some embodiments, the thickness of the sense electrode layer 10 can range from about 2 um to about 100 um. In other embodiments, the thickness of the sense electrode layer 10 can range from about 0.1 mm to about 1 mm.

The dielectric base layer 11 can be formed of any insulating material used in the art. In some configurations, the dielectric base layer 11 can be formed of FR4, polyimide, PET, silicon oxide, or other dielectric materials.

The dielectric base layer 11 can comprise any thickness that provides the desired dielectric nature of the layer given the insulating material used. In some embodiments, the thickness of the dielectric base layer 11 can range from about 50 um to about 2 mm.

The shield layer 25 can be formed of any conductive material used in the art. In some embodiments, the shield layer 25 can be form of metals or metallic alloys including copper, aluminum, gold, silver, indium tin oxide, carbon, or any other conductive material.

The shield layer 25 can comprise any thickness that provides the desired conductivity of the layer. In some embodiments, the thickness of the shield layer 25 can range from about 2 um to about 1 mm.

As depicted in FIG. 1, the shield layer 25 comprises driven portion 21 and grounded portion 22. The driven portion 21 and grounded portion 22 can be formed of different materials or thickness than the rest of the shield layer 25. In some embodiments, though, the driven portion 21 and grounded portion 22 are formed of a similar material and thickness as the rest of the shield layer 25.

In operation, the conductor in a self-capacitance electrode is driven with a toggling or changing voltage. As the toggle voltage is applied, the conductor stores a charge according to the system's default capacitance. The toggle voltage can vary based on the specific application of the sensor. Higher voltages can increase the electric field but consume more energy. Therefore, the actual toggle voltage is adjusted based on the needs of the specific device and application. The actual value of the toggle voltage is not relevant to the present application, but a person having skill in the art would understand that the principles disclosed herein can be applied to many different systems with differing toggle voltages.

When an external object capable of conducting electricity is introduced into the system, the capacitance is changed. This change in capacitance can be measured, but the specific method for measuring the change is not relevant to the present application. The present application pertains to a system and method for obtaining a signal on the sense electrode that is protected from stray capacitance and electrical noise while also increasing the projected electric field and proximity sensitivity.

A toggle voltage can be applied to sense electrode layer 10 of the self-cap sensor. When an external object is brought into the proximity of sense electrode layer 10, the capacitance of the self-cap sensor changes and this change can then be measured. The driven portion 21 of the shield layer 25 can be driven with a voltage higher than the toggle voltage of sense electrode layer 10 to increase the projected electric field, increasing the proximity sensitivity. In these embodiments, the grounded portion 22 of the shield layer 25 has no voltage applied to it and therefore functions to block electrical noise.

In some configurations, the shield electrode layer 25 can be disposed near a capacitance sense electrode that is driven with a known voltage. The driven shield portion can make up anywhere from 5% to 20% of the total area of the shield electrode, with the grounded portion making up the remaining area. In relation to the voltage applied to sense electrode, the voltage applied to the driven portion is increased by a multiplier that is equal to the ratio of the area of the grounded portion to the area of the driven portion. In some configurations, the average voltage of all the shield portions can be equal to the voltage on the sense electrode.

In some configurations, the following equation can be used to operate a sensor with n number of shielding portions with as many different voltages:

$$V_{sense} = (V_1 A_1 + V_2 A_2 + V_n A_n)/A_{total}$$

where $V_x$ is the voltage of each portion and $A_x$ is the area of each portion. The voltage can be zero for a grounded portion and a strongly driven portion could be offset by a negative voltage portion. In some embodiments, the driven portion of the shield electrode is about 20% of the total area of the shield electrode with the other 80% of the total area of the shield electrode being the grounded portion. The voltage applied to the driven portion would be about four times the voltage applied on the sense electrode. Obviously, no voltage would be applied to the grounded portion. The higher driving voltage can be supplied by an amplifier or from a rail to rail toggling signal that is synchronous with the sense electrode. These embodiments of the shield not only effectively eliminate parasitic capacitance but also greatly increase the projected electric field.

FIG. 2 depicts the component layers in FIG. 1 from a top view. In this rectangular embodiment, sense electrode layer 10 is formed on the top surface dielectric base layer 11. Shield layer 25 is formed on the bottom of dielectric base layer 11 so that the two layers are parallel, similar to the depictions in FIG. 1. The dielectric layer could be one or more layers of different dielectric materials, such as when 2 or more substrates with adhered conductors are laminated together. In other embodiments, the sense electrode and the shield electrode can be formed in different shapes. These shapes include a circular shape, square shaped, donut shaped, C shaped, and any other shape as deemed necessary for the specific application of the self-capacitance sensor.

In some configurations, shield layer 25 can be slightly larger than sense electrode layer 10 so that driven portion 21 of shield layer 25 extends past the edges of the sense electrode 10. These configurations allow for the driven portion 21 to further shape and extend the electric field of sense electrode 10. In some embodiments, driven portion 21 extends about 10% beyond the edges of sense electrode 10. In other embodiments, the driven potion 21 can extend past the edges of sense electrode 10 by about 50%. Driven portion 21 can be driven with a larger voltage than the toggle voltage of sense electrode layer 10. This larger voltage is calculated by multiplying the toggle voltage of sense electrode layer 10 by the ratio of the area of the grounded portion 22 to the area of the driven portion 21.

The devices described herein can be made by any method that provides the structures described. In some embodiments, these methods include masking, deposition, and etching method commonly used in industry. But a person having ordinary skill in the art would recognize that making the self-capacitance sense electrode described herein can be achieved by other process known in industry.

Some methods for making these devices begin by providing any substrate. For some embodiments, the substrate comprises silicon. As depicted in FIG. 3, a dielectric base layer 11 with top surface 12 can then be provided on the substrate by either oxidizing the silicon to provide a silicon oxide layer or by depositing the material for the dielectric layer until the desired thickness is obtained. Next, the conducting material for the sense electrode layer 10 can be deposited on the top surface 12 of dielectric base layer 11 until the desired thickness of the sense electrode layer 10 is obtained. The method continues by masking and etching the sense electrode layer 10 to obtain the desired width of this layer on the dielectric base layer 11, as shown in FIG. 3.

Next, the substrate can be removed from the bottom of the dielectric base layer 11. The dielectric base layer 11 can then be flipped and a conducting material is deposited to form the shield electrode layer 25, comprised of driven portion 21 and grounded portion 22, on the bottom surface 13 of dielectric base layer 11 as depicted in FIG. 4. If needed, the shield electrode layer can be subject to masking and etching processes to obtain the desired dimensions of the shield electrode layer 25. If the driven portion 21 and grounded portion 22 are formed of different conducting materials, that material can be deposited, masked, and etched to form the structure formed shown in FIG. 4.

Some conventional methods for protecting conductors from electrical noise is to place a grounded shield around them. The problem with this grounded shield is that it can also act as a conductor and cause parasitic capacitance, or an undesired change in capacitance. It also reduces the proximity sensitivity by reducing the electric field of the driven conductor. To reduce the parasitic capacitance while maintaining the protection from electrical noise, the prior art teaches the use of a driven shield. These driven shields are driven with a similar voltage and phase that is used to drive the conductor that is being shielded. This results in there being no voltage difference between the shield and driven conductor. Thus, there is no effective parasitic capacitance between the shield and the conductor. This is best achieved by buffering the sensor signal and using a low impedance signal to drive the shield. This results in no net parasitic capacitance between the shielded conductor and the shield or anything past the shield. Therefore, the parasitic capacitance is reduced. This method in the prior art does not address the reduction in proximity sensitivity.

In other embodiments, the shield electrode can be further divided into more portions to facilitate dynamic adjustments of the balance between the voltage on the sense electrode and the driven portion of the shield electrode. The addition of these other portions helps to overcome the manufacturing and environmental changes that might occur and that can affect the shaping of the electric field. To allow for these dynamic adjustments, the other portions (including multiple driven portions driven by different voltages) could be controlled individually. As well, these multiple potions can be driven with the same voltage as the driven portion, they can be driven with an inverted phase compared to the driven portion, they can be grounded, or they can be electrically floating.

As shown in FIG. 5, in some configurations, there could be an outer shield portion that is driven with a significantly higher voltage than the electrode and this shield would extend beyond the entire perimeter to increase the projected electric field. In these configurations, there could then be multiple driven shields in the interior of the outer driven shield that could be used for further shielding and to provide a counter offset to the large offset incurred by the perimeter shield. The shapes of the inner portions have little impact on the sensor performance in these configurations, so their surface area and voltages are important attributes. These inner driven shield portions could be squares, circles, triangles or some other arbitrary shape that is convenient for other reasons such as PCB (printed circuit board) routing or shielding over noisy routes.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

The invention claimed is:

1. A capacitance sensor, comprising:
    a dielectric base layer with first and second surface;
    a capacitance sense electrode adjacent the first surface of the dielectric base layer, the capacitance sense electrode configured to be driven using a toggle voltage and detect a change in capacitance; and
    a shield electrode adjacent the second surface of the dielectric base layer, the shield electrode being divided into multiple portions wherein the multiple portions of the shield electrode comprises a driven portion and a grounded portion, and
    wherein the driven portion is configured to be driven by a voltage substantially equal to the toggle voltage of the capacitance sense electrode multiplied by the area of the grounded portion divided by the area of the driven portion.

2. The sensor of claim 1, wherein the voltage applied to the driven portion is about four times the voltage applied to the capacitance sense electrode and the driven portion is 20% of the total area of the shield electrode with the other 80% of the total area of the shield electrode being the grounded portion.

3. The sensor of claim 1, wherein the outer edges of the driven portion extend past the edges of the capacitance sense electrode.

4. The sensor of claim 3, wherein the outer edges of the driven portion extend past the edges of the capacitance sense electrode by about 10%.

5. The sensor of claim 1, wherein the multiple portions of the shield electrode comprises multiple driven portions.

6. The sensor of claim 5, wherein each of the multiple driven portions are driven with different voltages.

7. The sensor of claim 1, wherein the multiple portions of the shield electrode comprises multiple driven portions and a grounded portion.

8. The sensor of claim 7, wherein each of the multiple driven portions are driven with different voltages.

9. A system for detecting the proximity of an object, comprising:
  a printed circuit board; and
  a capacitance sensor connected to the printed circuit board, the sensor comprising:
    a dielectric base layer with first and second surface;
    a capacitance sense electrode adjacent the first surface of the dielectric base layer, the capacitance sense electrode configured to be driven using a toggle voltage and detect a change in capacitance; and
    a shield electrode adjacent the second surface of the dielectric base layer, the shield electrode being divided into multiple portions wherein the multiple portions of the shield electrode comprises a driven portion and a grounded portion, and wherein the driven portion is configured to be driven by a voltage substantially equal to the toggle voltage of the capacitance sense electrode multiplied by the area of the grounded portion divided by the area of the driven portion.

10. The system of claim 9, wherein the outer edges of the driven portion extend past the edges of the capacitance sense electrode.

11. The system of claim 10, wherein the outer edges of the driven portion extend past the edges of the capacitance sense electrode by about 10%.

12. The system of claim 9, wherein the multiple portions of the shield electrode comprises multiple driven portions.

13. The system of claim 12, wherein each of the multiple driven portions are driven with different voltages.

14. The system of claim 9, wherein the multiple portions of the shield electrode comprises multiple driven portions and a grounded portion.

15. The system of claim 14, wherein each of the multiple driven portions are driven with different voltages.

16. A method for making a capacitance sensor, comprising:
  providing a dielectric base layer with first and second surface;
    providing a capacitance sense electrode adjacent to the first surface of the dielectric base layer;
    providing a shield electrode adjacent to the second surface of the dielectric base layer with the shield electrode being divided into multiple portions, wherein the multiple portions of the shield electrode comprise a driven portion and a grounded portion;
    driving the capacitance sense electrode using a toggle voltage configured to detect a change in capacitance in the sensor; and
    wherein the driven portion is driven by a voltage substantially equal to the toggle voltage of the capacitance sense electrode multiplied by the area of the grounded portion divided by the area of the driven portion.

17. The method of claim 16, wherein the voltage applied to the driven portion is about four times the voltage applied to the capacitance sense electrode and the driven portion is 20% of the total area of the shield electrode with the other 80% of the total area of the shield electrode being the grounded portion.

18. The method of claim 16, wherein the outer edges of the driven portion extend past the edges of the capacitance sense electrode.

19. The method of claim 18, wherein the outer edges of the driven portion extend past the edges of the capacitance sense electrode by about 10%.

20. The method of claim 16, wherein the multiple portions of the shield electrode comprises multiple driven portions and a grounded portion.

21. The method of claim 20, wherein each of the multiple driven portions are driven with different voltages.

22. The method of claim 16, wherein the multiple portions of the shield electrode comprises multiple driven portions.

23. The method of claim 22, wherein each of the multiple driven portions are driven with different voltages.

* * * * *